United States Patent
Chen et al.

(10) Patent No.: US 10,163,485 B2
(45) Date of Patent: Dec. 25, 2018

(54) MEMORY MODULE, MEMORY CONTROLLER AND ASSOCIATED CONTROL METHOD FOR READ TRAINING TECHNIQUE

(71) Applicant: MEDIATEK INC., Hsin-Chu (TW)

(72) Inventors: Shang-Pin Chen, Hsinchu County (TW); Bo-Wei Hsieh, Tainan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/480,382

(22) Filed: Apr. 6, 2017

(65) Prior Publication Data
US 2017/0345480 A1    Nov. 30, 2017

Related U.S. Application Data

(60) Provisional application No. 62/341,609, filed on May 25, 2016.

(51) Int. Cl.
| | |
|---|---|
| *G11C 11/4076* | (2006.01) |
| *G11C 11/406* | (2006.01) |
| *G11C 11/4094* | (2006.01) |
| *G11C 11/4096* | (2006.01) |
| *G06F 13/16* | (2006.01) |
| *G11C 29/02* | (2006.01) |

(52) U.S. Cl.
CPC ...... *G11C 11/4076* (2013.01); *G06F 13/1689* (2013.01); *G11C 11/406* (2013.01); *G11C 11/4094* (2013.01); *G11C 11/4096* (2013.01); *G11C 29/022* (2013.01)

(58) Field of Classification Search
CPC ............ G11C 11/4076; G11C 11/4096; G11C 11/406; G11C 11/4094
See application file for complete search history.

(56) References Cited

U.S. PATENT DOCUMENTS

| | | | |
|---|---|---|---|
| 7,532,218 B1 | 5/2009 | Wagner | |
| 2014/0195728 A1* | 7/2014 | Hsu | G06F 12/0246 711/105 |
| 2015/0149735 A1* | 5/2015 | Nale | G11C 29/023 711/147 |
| 2015/0186310 A1 | 7/2015 | Levy | |

* cited by examiner

*Primary Examiner* — Tri Hoang
(74) *Attorney, Agent, or Firm* — Winston Hsu (57) ABSTRACT

A memory module includes a memory interface circuit and a training signal generator. The memory interface circuit includes a plurality of terminals for communicating with a memory controller, and the terminals comprise at least a plurality of data terminals. The training signal generator is coupled to the memory interface circuit, and is arranged for generating a training signal to the memory controller through only a portion of the data terminals or a specific terminal instead of the data terminals when the memory module receives a training request from the memory controller.

29 Claims, 6 Drawing Sheets

MEMORY MODULE, MEMORY CONTROLLER AND ASSOCIATED CONTROL METHOD FOR READ TRAINING TECHNIQUE

CROSS REFERENCE TO RELATED APPLICATIONS

This application claims the priority of U.S. Provisional Application No. 62/341,609, filed on May 25, 2016, which is included herein by reference in its entirety.

BACKGROUND

In a conventional dynamic random access memory (DRAM) system, a read training is required to be performed to optimize timing between data signals and a data strobe signal. When the read training operation is executed, however, all of the data pins (DQ pins) are required to be toggled or driven to obtain the timing information, causing more power consumption.

SUMMARY

It is therefore an objective of the present invention to provide a read training technique, where the training signal is transmitted through only a portion of the DQ pins or a specific pin instead of any DQ pin, to solve the above-mentioned problem.

According to one embodiment of the present invention, a memory module comprises a memory interface circuit and a training signal generator. The memory interface circuit comprises a plurality of terminals for communicating with a memory controller, and the terminals comprises at least a plurality of data terminals. The training signal generator is coupled to the memory interface circuit, and is arranged for generating a training signal to the memory controller through only a portion of the data terminals or a specific terminal instead of the data terminals when the memory module receives a training request from the memory controller.

According to another embodiment of the present invention, a control method of a memory module is provided, wherein the memory module comprises a memory interface circuit comprising a plurality of terminals for communicating with a memory controller, the terminals comprises at least a plurality of data terminals, and the control method comprises: receiving a training request from the memory controller; and generating a training signal, in response to the training request, to the memory controller through only a portion of the data terminals or a specific terminal instead of the data terminals.

According to another embodiment of the present invention, a memory controller comprises a memory interface circuit and a control circuit. The memory interface circuit comprises a plurality of terminals for communicating with a memory module, and the terminals comprise at least a plurality of data terminals. The control circuit is arranged for generating a training request to the memory module, and receiving a training signal, in response to the training request, from the memory module through only a portion of the data terminals or a specific terminal instead of the data terminals, and determining clock timing information according to the training signal.

According to another embodiment of the present invention, a control method of a memory controller is provided, wherein the memory controller comprises a memory interface circuit comprising a plurality of terminals for communicating with a memory module, the terminals comprises at least a plurality of data terminals, and the control method comprises: generating a training request to the memory module; receiving a training signal, in response to the training request, from the memory module through only a portion of the data terminals or a specific terminal instead of the data terminals; and determining clock timing information according to the training signal.

In the embodiments of the present invention, the clock timing information between the data signal and the clock signal (data strobe signal) can be simply obtained, and the power consumption can be improved because not all of the data terminals (data pins) are driven or toggled during the training operation. In addition, the training operation can be run-time performed to obtain the clock timing information, therefore, the timing calibration is more efficient.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
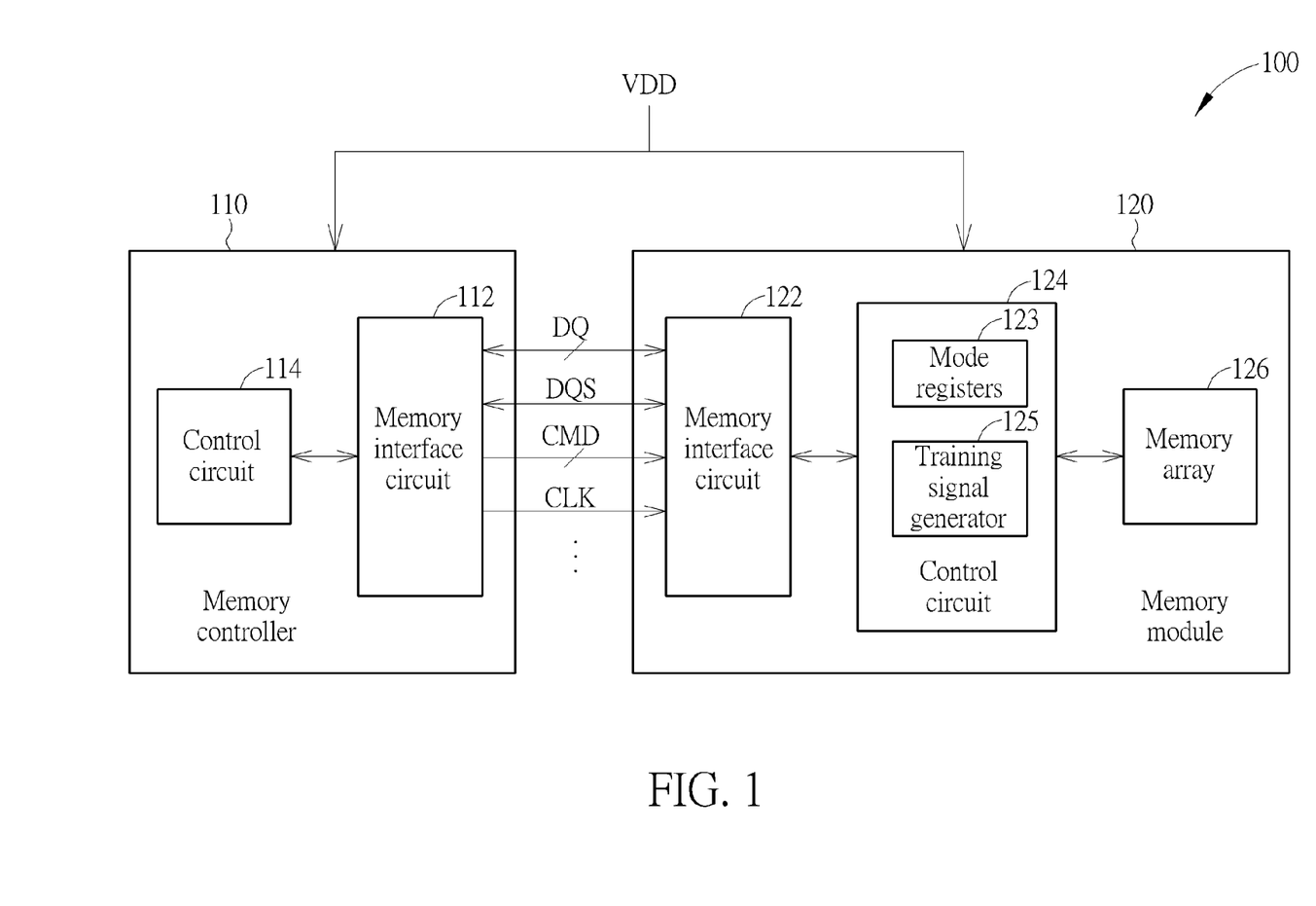
FIG. 1 is a diagram illustrating a memory system according to one embodiment of the present invention.

Please refer to FIG. 1, which is a diagram illustrating a memory system 100 according to one embodiment of the present invention. As shown in FIG. 1, the memory system 100 comprises a memory controller 110 and a memory module 120 supplied by a supply voltage VDD, where the memory controller 110 comprises a memory interface circuit 112 and a control circuit 114, and the memory module 120 comprises a memory interface circuit 122, a control circuit 124 comprising mode registers 123 and a training signal generator 124, and a memory array 126. In this embodiment, the memory controller 110 and the memory module 120 are connected via a plurality of connection lines, where the connection lines are used to transmit at least a plurality of a bi-directional data signal DQ, a bi-directional data strobe signal DQS, a plurality of command signals CMDs, a differential clock signal CLK. In addition, in this embodiment, the memory system 100 is a volatile memory system such as a DRAM system, that is the memory controller 110 is the DRAM memory controller, and the memory module 120 is a DRAM memory module.

When the memory system 100 is implemented by the DRAM system the command signals may comprise at least a row address strobe, a column address strobe, and a write enable signal. In addition, the clock signal or the command signals shown in FIG. 1 can be single-directional or bi-directional.

In the general operations of the memory system 100, the memory controller 110 is arranged to receive a request from a host or a processor, and to transmit at least a portion of the data signal DQ, data strobe signal DQS, command signals CMDs, the clock signal CLK and the clock enable signal CKE to access the memory module 120. In addition, the control circuit 114 within the memory controller 110 may comprise associated circuits, such as an address decoder, a processing circuit, a write/read buffer, a control logic and an arbiter, to perform the related operations. The memory interface circuit 112 of the memory controller 110 is arranged to output the data signal DQ, data strobe signal DQS, command signals CMDs, the clock signal CLK to the memory module 120. The memory interface circuit 122 is arranged to receive the data signal DQ, data strobe signal DQS, command signals CMDs and the clock signal CLK from the memory controller 110, and to output the data to the memory controller via the DQ connection lines. The control circuit 124 may comprise a read/write controller, a row decoder and a column decoder, and the control circuit 124 is arranged to receive output signals from the memory interface circuit 122 to access the memory array 126.

When the memory controller 110 wants to read data from the memory module 120, the memory controller 110 sends a read request and associated clock signal CLK to the memory module 120 first, and the memory module will transmit the data signal DQ and the data strobe signal DQS, in response to the read request, to the memory controller 110, then the memory controller 110 uses the received data strobe signal DQS to sample the data signal DQ to obtain the required data. The data strobe signal DQS generated by the memory module 120 is generated according to the clock signal CLK from the memory controller 110, so the timing (e.g. phase shift or signal delay) of the data strobe signal DQS may be varied due to the voltage and temperature variation. Therefore, in the embodiments of the present invention, a run-time read training operation (i.e. timing estimation and calibration) is executed to make sure that the data signal DQ and the data strobe signal DQS have an appropriate timing relationship.

Figure 2:
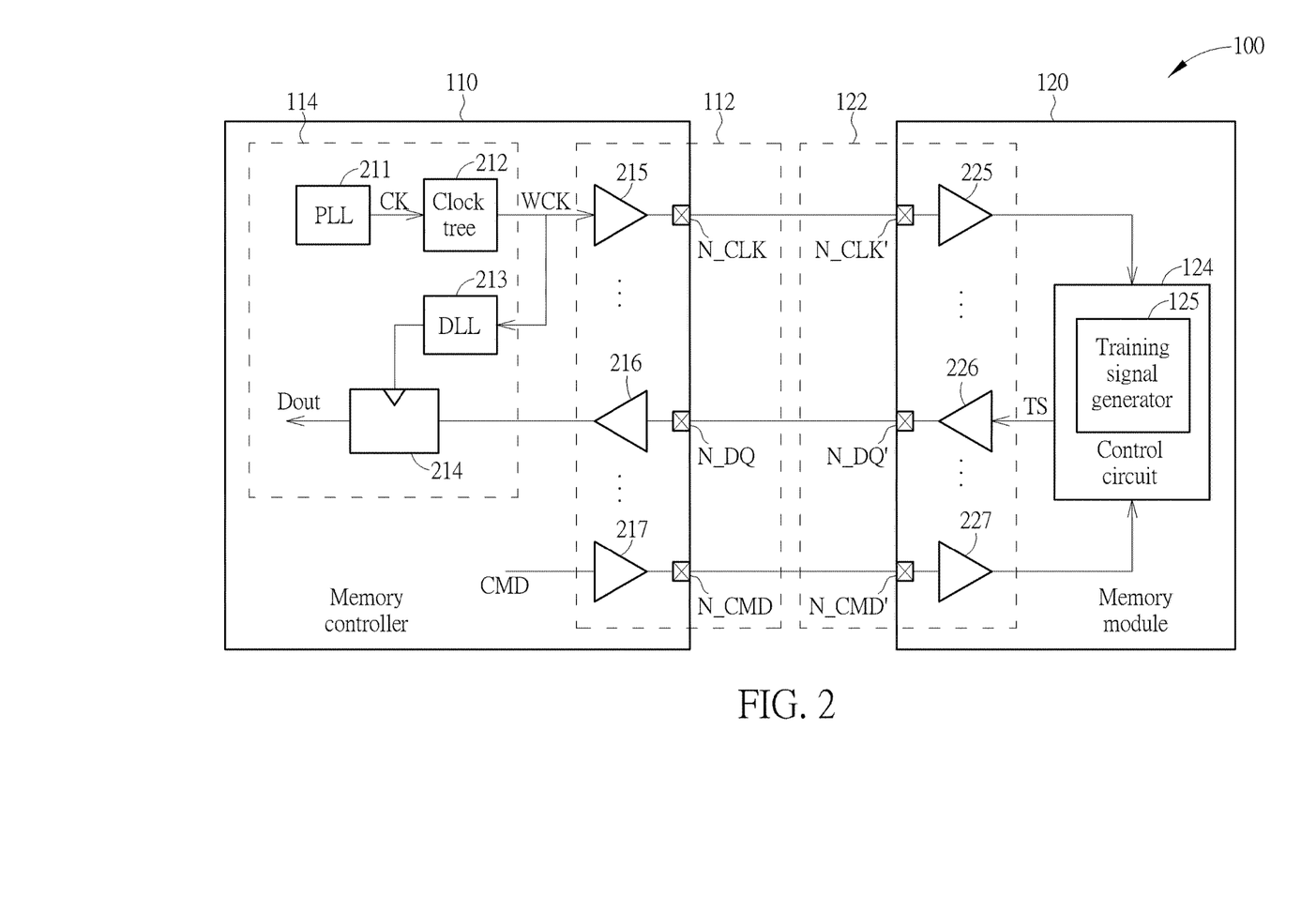
FIG. 2 is a diagram illustrating detailed structure of the memory system according to one embodiment of the present invention.

Please refer to FIG. 2, which is a diagram illustrating detailed structure of the memory system 100 according to one embodiment of the present invention. As shown in FIG. 2, the control circuit 114 within the memory controller 110 comprises a phase-locked loop (PLL) 211, a clock tree 212, a delay-locked loop (DLL) 213 and a sampling circuit 214; the memory interface circuit 112 comprises a plurality of receivers, drivers and input/output (I/O) terminals (e.g. I/O pins or I/O pads), where FIG. 2 only shows two drivers 215 and 217, a receiver 216 and three I/O terminals N_CLK, N_DQ and N_CMD for brevity. In addition, the memory interface circuit 122 within the memory module 120 comprises a plurality of receivers, drivers and I/O terminals (e.g. I/O pins or I/O pads), and FIG. 2 only shows two receiver 225 and 227, a driver 226 and three I/O terminals N_CLK', N_DQ' and N_CMD' for brevity. It is noted that FIG. 2 merely shows the elements related to the training operation of the embodiment, a person skilled in the art should understand that the memory controller 110 and the memory module 120 comprise other elements for the general operations.

In the operations of the memory system shown in FIG. 2, at first the memory controller 110 sends the training request to the memory module 120 to enable the read training. The read training can be enabled by using one of the following embodiments: the memory controller 110 sends a special or a new type command to the memory module 120 via the driver 217, I/O pins N_CMD and N_CMD' and the receiver 227; the memory controller 110 encodes a training enable bit with a conventional command signal, and transmits the command signal to the memory module 120 via the driver 217, the I/O pins N_CMD and N_CMD' and the receiver 227, where the conventional command signal may be a pre-charge command, an activate command, a refresh command, a write command or a multi-purpose command; the mode registers 123 within the memory module 120 may set a training enable bit corresponding to a specific command signal (e.g. the refresh command), and once the memory controller 110 sends the specific command signal (e.g. the refresh command) to the memory module 120, the control circuit 124 will enable the read training operation; or the memory controller 110 may send the training request to the memory module 120 with a side-band signal via an error detection and correction (EDC) pin of the DRAM system.

After the memory controller 110 sends the training request to the memory module 124, the memory controller 110 starts to generate a clock signal to the memory module 120. In detail, the PLL 211 generates a clock signal CK, and the clock tree 212 generates a write clock signal WCK according to the clock signal CK, where a frequency of the write clock signal WCK may be equal to or greater than the clock signal CK. Then, the driver 215 sends the write clock signal WCK to the memory module 120 via the I/O terminals N_CLK and N_CLK' and the receiver 225.

After receiving the write clock signal WCK from the memory controller 110, the training signal generator 125 within the control circuit 124 generates a training signal TS according to the write clock signal WCK. In several embodiments of the present invention, the training signal TS can be a pre-defined signal or a programmable signal, or the training signal TS can be the same as the write clock signal WCK (e.g. the write clock signal directly serves as the training signal TS), or the training signal TS a frequency-divided write clock signal. Then, the driver 226 sends the training signal TS to the memory controller 110 via the I/O terminals N_DQ' and N_DQ and the receiver 216.

In one embodiment of the present invention, the memory module 120 uses only one of the data I/O terminals (e.g. DQ pins) to transmit the training signal TS to the memory controller 110, that is only one bit of the data bus is toggled, and other bits of the data bus are not driven or toggled. For example, assuming that the data signal DQ is 32 bits and the memory interface circuit 112/122 has 32 DQ pins, only one of the DQ pins is driven for the training signal TS, and the other DQ pins are not driven or toggled.

In another embodiment of the present invention, the memory module 120 uses the aforementioned EDC pin to transmit the training signal TS to the memory controller 110, and all of the DQ pins within the memory interface circuit 112/122 are not driven or toggled.

In another embodiment of the present invention, the memory module 120 uses the aforementioned EDC pin to transmit the training signal TS to the memory controller 110, and the DQ pins within the memory interface circuit 112/122 are used for data writing in response to a write command of the memory controller 110.

After receiving the training signal TS from the memory module 120, the sampling circuit 214 uses a clock signal generated from the DLL 213 to sample the training signal TS to generate a sampling result Dout. The sampling result Dout can serve as the clock timing information between the training signal TS and the clock signal CK, and a clock delay information within the memory module 120 and a timing relationship between the data signal DQ and the data strobe signal DQS can be further estimated according to the sampling result Dout.

By using the embodiment shown in FIG. 2, because the training operation requires only one I/O terminal to transmit the training signal TS, the overall power consumption can be lowered. Furthermore, because of the simplified training operation of the embodiment, the training operation can be performed more often to calibrate the clock timing, and the data accuracy can be improved.

Figure 3:
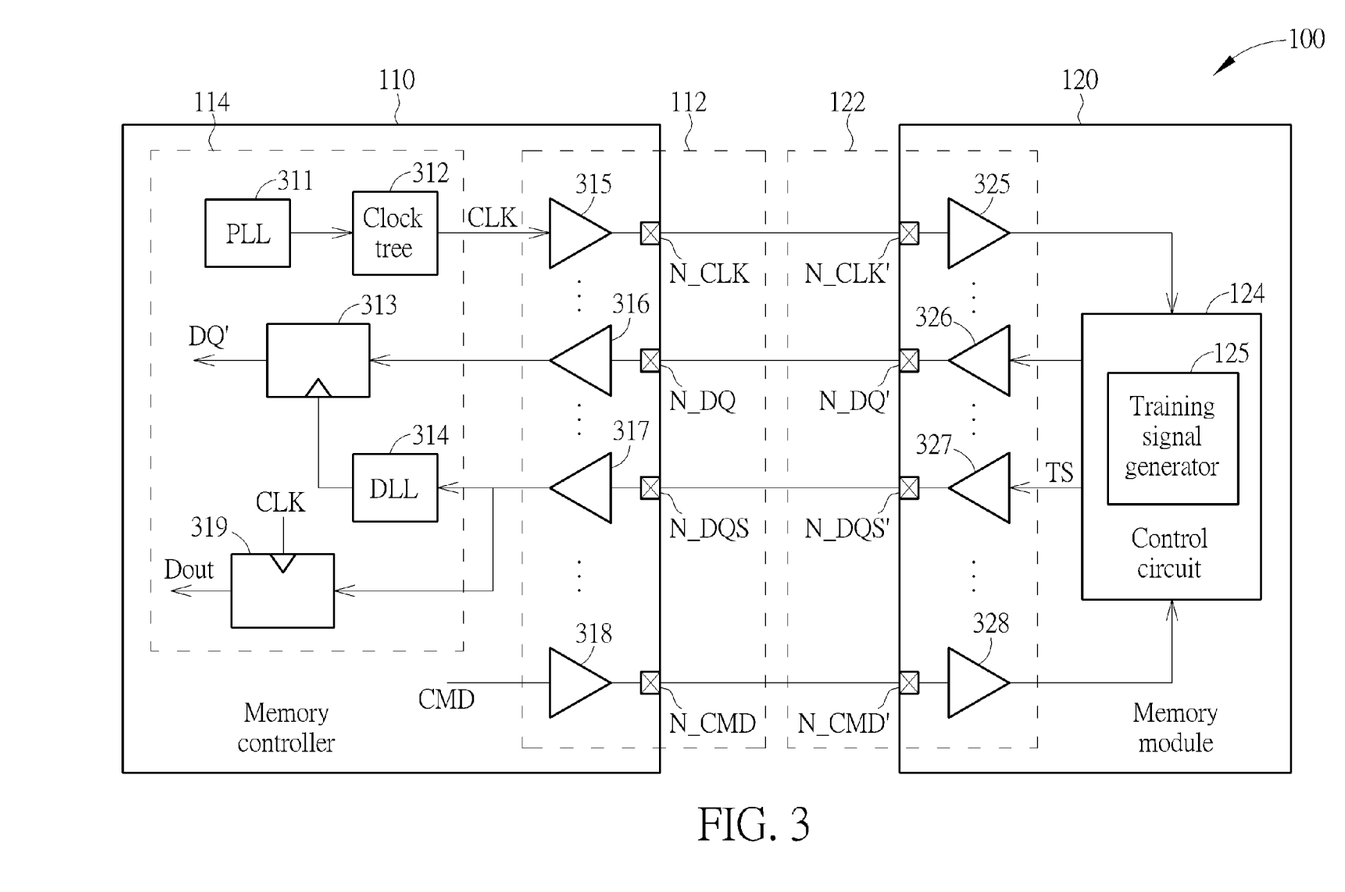
FIG. 3 is a diagram illustrating detailed structure of the memory system according to another embodiment of the present invention.

Please refer to FIG. 3, which is a diagram illustrating detailed structure of the memory system 100 according to another embodiment of the present invention. As shown in FIG. 3, the control circuit 114 within the memory controller 110 comprises a PLL 311, a clock tree 312, two sampling circuits 313 and 319, and a DLL 314; the memory interface circuit 112 comprises a plurality of receivers, drivers and I/O terminals (e.g. I/O pins or I/O pads), where FIG. 3 only shows two drivers 315 and 318, two receivers 316 and 317 and four I/O terminals N_CLK, N_DQ, N_DQS and N_CMD for brevity. In addition, the memory interface circuit 122 within the memory module 120 comprises a plurality of receivers, drivers and I/O terminals (e.g. I/O pins or I/O pads), and FIG. 3 only shows two receiver 325 and 328, two drivers 326 and 327 and three I/O terminals N_CLK', N_DQ', N_DQS' and N_CMD' for brevity. It is noted that FIG. 3 merely shows the elements related to the training operation of the embodiment, a person skilled in the art should understand that the memory controller 110 and the memory module 120 comprise other elements for the general operations.

In the operations of the memory system shown in FIG. 3, at first the memory controller 110 sends the training request to the memory module 120 to enable the read training. The read training can be enabled by using one of the following embodiments: the memory controller 110 sends a special or a new type command to the memory module 120 via the driver 318, I/O pins N_CMD and N_CMD' and the receiver 328; the memory controller 110 encodes a training enable bit with a conventional command signal, and transmits the command signal to the memory module 120 via the driver 318, the I/O pins N_CMD and N_CMD' and the receiver 328, where the conventional command signal may be a pre-charge command, an activate command, a refresh command, a write command or a multi-purpose command; the mode registers 123 within the memory module 120 may set a training enable bit corresponding to a specific command signal (e.g. the refresh command), and once the memory controller 110 sends the specific command signal (e.g. the refresh command) to the memory module 120, the control circuit 124 will enable the read training operation; or the memory controller 110 may send the training request to the memory module 120 with a side-band signal via the EDC pin of the DRAM system.

After the memory controller 110 sends the training request to the memory module 124, the memory controller 110 starts to generate a clock signal to the memory module 120. In detail, the clock tree 312 generates a clock signal according to an output of the PLL 311. Then, the driver 315 sends the clock signal CLK to the memory module 120 via the I/O terminals N_CLK and N_CLK' and the receiver 325.

After receiving the clock signal CLK from the memory controller 110, the training signal generator 125 within the control circuit 124 generates a training signal TS according to the clock signal CLK. In several embodiments of the present invention, the training signal TS can be a pre-defined signal or a programmable signal, or the training signal TS can be the same as the clock signal CLK (e.g. the clock signal CLK directly serves as the training signal TS), or the training signal TS a frequency-divided clock signal. Then, the driver 327 sends the training signal TS to the memory controller 110 via the I/O terminals N_DQS' and N_DQS and the receiver 317.

In the conventional operations regarding the data signal DQ and the data strobe signal DQS, when the DLL receives 314 the DQS signal to generate a clock signal, and the sampling circuit 313 uses the clock signal to sample the received data signal DQ to generate an sample data signal DQ'. In the embodiment shown in FIG. 3, because the DQS pin is used to transmit the training signal TS to the memory controller 110, so all of the DQ pins may not be driven or toggled, and the sampling circuit 313 does not need to work. For example, assuming that the data signal DQ is 32 bits and the memory interface circuit 112/122 has 32 DQ pins, all of the 32 DQ pins are not driven or toggled.

After receiving the training signal TS from the memory module 120, the sampling circuit 319 uses the clock signal CLK or any suitable clock signal within the memory controller 110 to sample the training signal TS to generate a sampling result Dout. The sampling result Dout can serve as the clock timing information between the training signal TS and the clock signal, and a clock delay information within the memory module 120 and a timing relationship between the data signal DQ and the data strobe signal DQS can be further estimated according to the sampling result Dout.

By using the embodiment shown in FIG. 3, because the training operation requires only the DQS pin to transmit the training signal TS, and all of the DQ pins are not driven or toggled, the overall power consumption can be lowered. Furthermore, because of the simplified training operation of the embodiment, the training operation can be performed more often to calibrate the clock timing, and the data accuracy can be improved.

Figure 4:
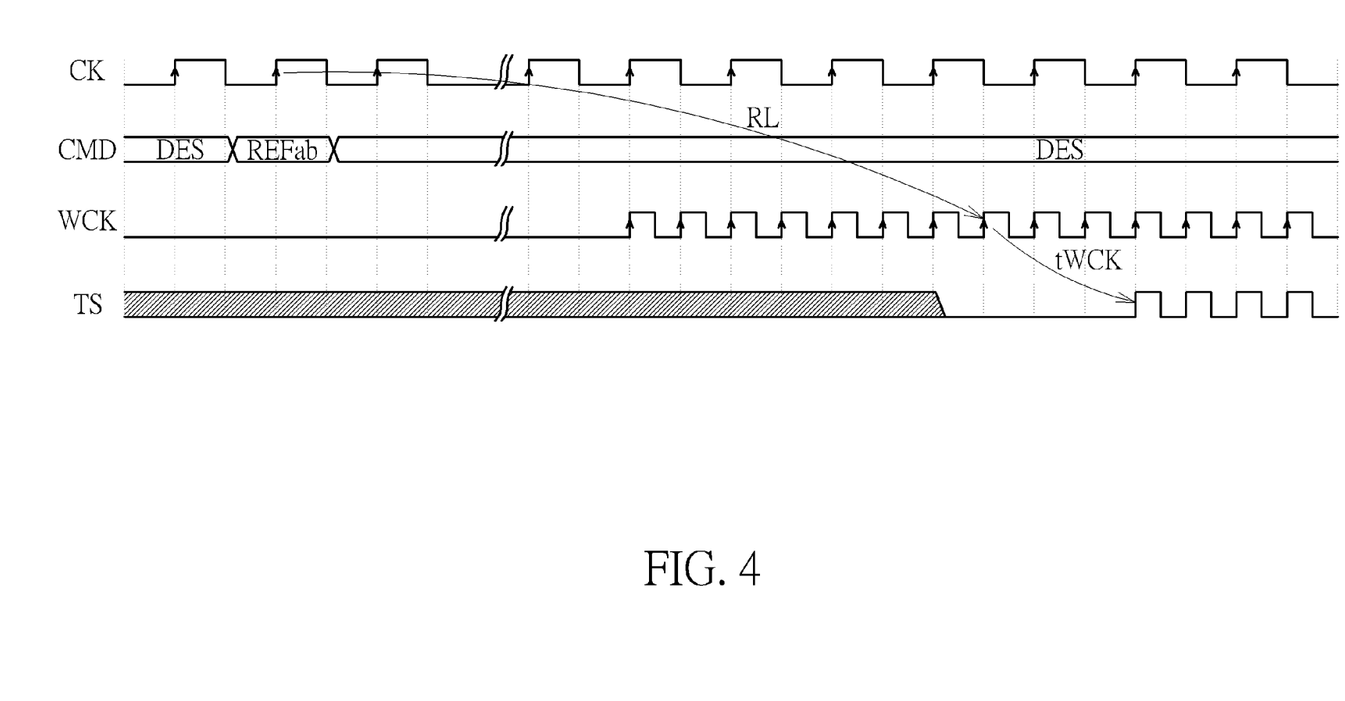
FIG. 4 shows a timing diagram of some signals of the embodiment shown in FIG. 2 according to one embodiment of the present invention.

FIG. 4 shows a timing diagram of some signals of the embodiment shown in FIG. 2 according to one embodiment of the present invention. In FIG. 4, it is assumed that the memory controller 110 sends the training request to the memory module 120 by using the refresh command, that is when the memory controller 110 sends the refresh command, the training operation is enabled and the memory module 120 sends the training signal TS to the memory controller 110 via a single DQ pin, a DQS pin or the EDC pin. As shown in FIG. 4, after the memory controller 110 generates the refresh command "REFab" (refresh all banks), the memory controller 120 generates the training signal TS to the memory controller 110 according to the write clock signal WOK. In FIG. 4, "DES" is a "de-select" command, and "RL" and "tWCK" are latency between different operating steps.

Figure 5:
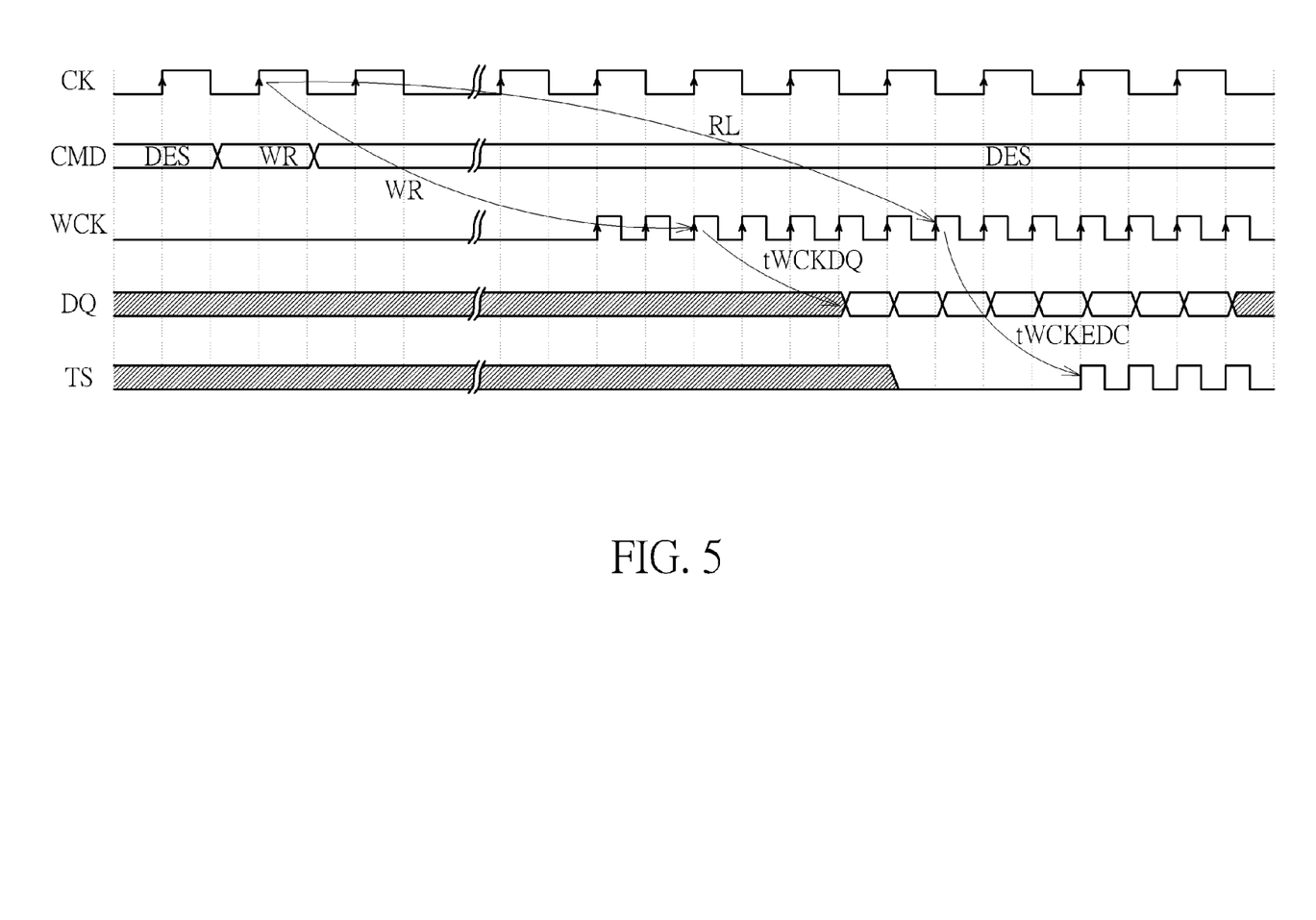
FIG. 5 shows a timing diagram of some signals of the embodiment shown in FIG. 2 according to another embodiment of the present invention.

FIG. 5 shows a timing diagram of some signals of the embodiment shown in FIG. 2 according to another embodiment of the present invention. In FIG. 5, it is assumed that the memory controller 110 sends the training request to the memory module 120 by using the write command, that is when the memory controller 110 sends the write command, the training operation is enabled and the memory module 120 sends the training signal TS to the memory controller 110 via the EDC pin. As shown in FIG. 5, after the memory controller 110 generates the write command "WR", the memory controller 110 starts to write data into the memory module 120 via all of the DQ pins, and the memory controller 120 generates the training signal TS to the memory controller 110 via the EDC pin. In FIG. 5, "DES" is a "de-select" command, and "WL", "RL", "tWCKDQ" and "tWCKEDC" are latency between different operating steps.

Figure 6:
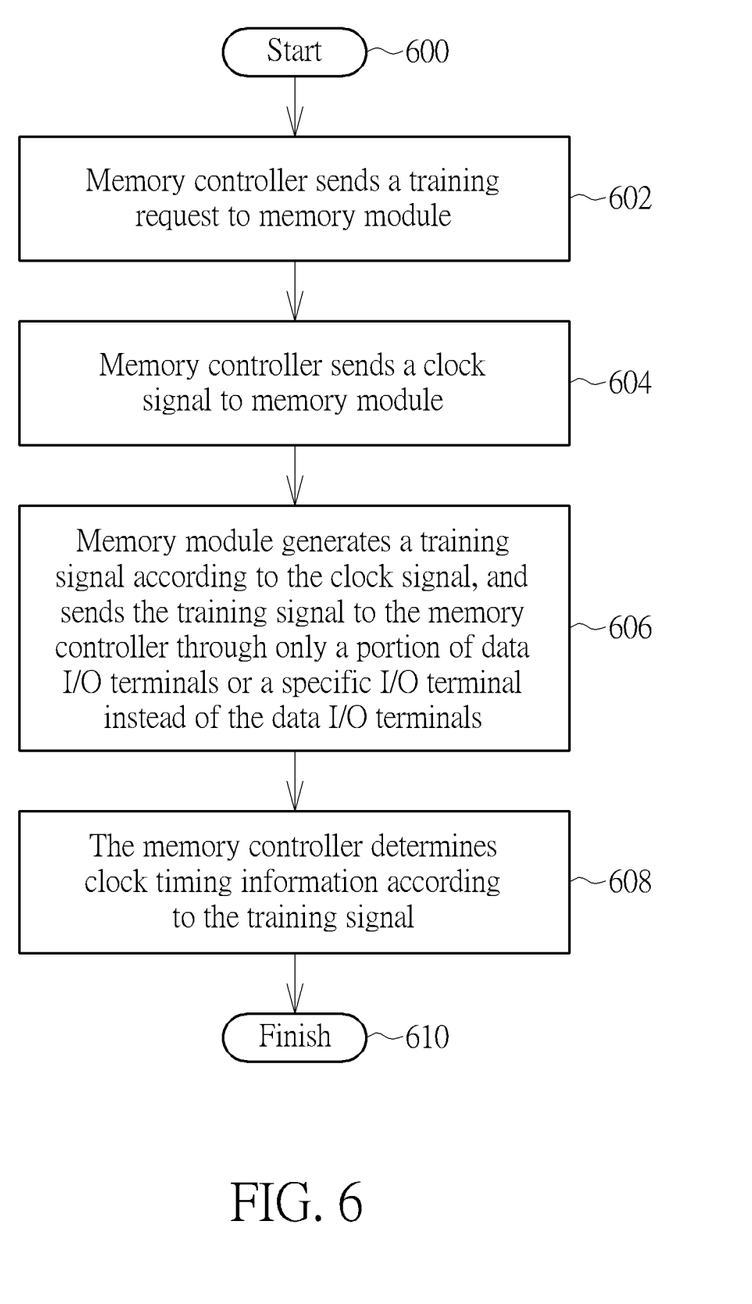
FIG. 6 is a flowchart of a control method of the memory system according to one embodiment of the present invention.

FIG. 6 is a flowchart of a control method of the memory system 100 according to one embodiment of the present invention. Referring to FIGS. 1-6 together, the flow is described as follows.

Step 600: the flow starts.
Step 602: memory controller sends a training request to memory module.
Step 604: memory controller sends a clock signal to memory module.
Step 606: memory module generates a training signal according to the clock signal, and sends the training signal to the memory controller through only a portion of data I/O terminals or a specific I/O terminal instead of the data I/O terminals.
Step 608: the memory controller determines clock timing information according to the training signal.
Step 610: the flow finishes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory module, comprising:
  a memory interface circuit, wherein the memory interface circuit comprises a plurality of terminals for communicating with a memory controller, and the terminals comprises at least a plurality of data terminals; and
  a training signal generator, coupled to the memory interface circuit, for generating a training signal to the memory controller through only a portion of the data terminals or a specific terminal instead of the data terminals when the memory module receives a training request from the memory controller;
  wherein when the training signal generator generates the training signal to the memory controller through only the portion of the data terminals, the other portion of the data terminals are not toggled or driven.

2. The memory module of claim 1, wherein the training signal generator transmits the training signal to the memory controller through only one of the data terminals.

3. The memory module of claim 1, wherein the memory module is applied in a dynamic random access memory (DRAM) system, and the specific terminal is for transmitting a DQS signal or a side-band signal.

4. The memory module of claim 3, wherein when the training signal generator transmits the training signal to the memory controller through the specific terminal, all of the data terminals are not toggled or driven.

5. The memory module of claim 1, wherein one of the terminals is used to receive a clock signal from the memory controller, and the training signal generator generates the training signal according to the clock signal.

6. The memory module of claim 5, wherein the training signal is the clock signal or a frequency-divided clock signal.

7. The memory module of claim 1, wherein the terminals further comprises a plurality of command terminals, and the training request is a command signal encoded with a training enable bit, and the training signal generator generates the command signal to the memory controller through one of the command terminals.

8. The memory module of claim 7, wherein the memory module is applied in a DRAM system, and the command signal is a pre-charge command, an activate command, a refresh command, a write command or a multi-purpose command.

9. The memory module of claim 1, wherein the memory module is applied in a DRAM system, and the memory module further comprises:
  a mode register, for setting a training enable bit corresponding to a specific command signal;
  wherein once the memory module receives the specific command signal from the memory controller, the training signal generator transmits the training signal to the memory controller through only the portion of the data terminals or the specific terminal.

10. A control method of a memory module, wherein the memory module comprises a memory interface circuit comprising a plurality of terminals for communicating with a memory controller, the terminals comprises at least a plurality of data terminals, and the control method comprises:
  receiving a training request from the memory controller; and
  generating a training signal, in response to the training request, to the memory controller through only a portion of the data terminals or a specific terminal instead of the data terminals;
  wherein when the training signal is generated to the memory controller through only the portion of the data terminals, the other portion of the data terminals are not toggled or driven.

11. The control method of claim 10, wherein the step of generating the training signal to the memory controller comprises:
  generating the training signal to the memory controller through only one of the data terminals.

12. The control method of claim 10, wherein the memory module is applied in a dynamic random access memory (DRAM) system, and the specific terminal is for transmitting a DQS signal or a side-band signal.

13. A memory controller, comprising:
  a memory interface circuit, wherein the memory interface circuit comprises a plurality of terminals for communicating with a memory module, and the terminals comprises at least a plurality of data terminals; and
  a control circuit, for generating a training request to the memory module, and receiving a training signal, in response to the training request, from the memory module through only a portion of the data terminals or a specific terminal instead of the data terminals, and determining clock timing information according to the training signal;
wherein when the control circuit receives the training signal from the memory module through only the portion of the data terminals, the other portion of the data terminals are not toggled or driven.

14. The memory controller of claim 13, wherein the control circuit receives the training signal from the memory module through only one of the data terminals.

15. The memory controller of claim 13, wherein the memory controller is applied in a dynamic random access memory (DRAM) system, and the specific terminal is for receiving a DQS signal or a side-band signal.

16. The memory controller of claim 13, wherein the terminals further comprises a plurality of command terminals, and the control circuit generates the training request by encoding a training enable bit with a command signal, and transmits the command signal to the memory module through one of the command terminals.

17. The memory controller of claim 16, wherein the memory controller is applied in a DRAM system, and the command signal is a pre-charge command, an activate command, a refresh command, a write command or a multi-purpose command.

18. The memory controller of claim 13, wherein the memory controller is applied in a DRAM system, and the control circuit generates the training request to the memory module through a specific terminal for transmitting/receiving a side-band signal.

19. The memory controller of claim 13, wherein when the control circuit generates the training request to the memory module through one of the command terminals, the control circuit further generates a clock signal to the memory module, and the control circuit determines the clock timing information according to the training signal and the clock signal.

20. The memory controller of claim 13, wherein the control circuit determines the clock timing information by using a signal derived from the clock signal to sample the training signal.

21. A control method of a memory controller, wherein the memory controller comprises a memory interface circuit comprising a plurality of terminals for communicating with a memory module, the terminals comprises at least a plurality of data terminals, and the control method comprises:
generating a training request to the memory module;
receiving a training signal, in response to the training request, from the memory module through only a portion of the data terminals or a specific terminal instead of the data terminals; and
determining clock timing information according to the training signal;
wherein when the training signal is received from the memory module through only the portion of the data terminals, the other portion of the data terminals are not toggled or driven.

22. The control method of claim 21, wherein the step of receiving the training signal comprises:
receiving the training signal from the memory module through only one of the data terminals.

23. The control method of claim 21, wherein the memory controller is applied in a dynamic random access memory (DRAM) system, and the specific terminal is for receiving a DQS signal or a side-band signal.

24. The control method of claim 21, wherein the terminals further comprises a plurality of command terminals, and the step of generating the training request to the memory module comprises:
generating the training request by encoding a training enable bit with a command signal; and
transmitting the command signal to the memory module through one of the command terminals.

25. The control method of claim 21, further comprising:
generating a clock signal to the memory module; and
the step of determining the clock timing information comprises:
determining the clock timing information according to the training signal and the clock signal.

26. A memory module, comprising:
a memory interface circuit, wherein the memory interface circuit comprises a plurality of terminals for communicating with a memory controller, and the terminals comprises at least a plurality of data terminals; and
a training signal generator, coupled to the memory interface circuit, for generating a training signal to the memory controller through a specific terminal instead of the data terminals when the memory module receives a training request from the memory controller;
wherein when the training signal generator transmits the training signal to the memory controller through the specific terminal, all of the data terminals are not toggled or driven.

27. The memory module of claim 26, wherein the memory module is applied in a dynamic random access memory (DRAM) system, and the specific terminal is for transmitting a DQS signal or a side-band signal.

28. A memory controller, comprising:
a memory interface circuit, wherein the memory interface circuit comprises a plurality of terminals for communicating with a memory module, and the terminals comprises at least a plurality of data terminals; and
a control circuit, for generating a training request to the memory module, and receiving a training signal, in response to the training request, from the memory module through a specific terminal instead of the data terminals, and determining clock timing information according to the training signal;
wherein when the training signal is received by the memory controller through the specific terminal, all of the data terminals are not toggled or driven.

29. The memory module of claim 28, wherein the memory controller is applied in a dynamic random access memory (DRAM) system, and the specific terminal is for transmitting a DQS signal or a side-band signal.

* * * * *